(12) United States Patent
Wu et al.

(10) Patent No.: US 11,461,625 B1
(45) Date of Patent: Oct. 4, 2022

(54) TENSOR COMPRESSION

(71) Applicant: Xilinx, Inc., San Jose, CA (US)

(72) Inventors: Michael Wu, Palo Alto, CA (US); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 337 days.

(21) Appl. No.: 16/881,612

(22) Filed: May 22, 2020

(51) Int. Cl.
| | | |
|---|---|---|
| *G06N 3/063* | (2006.01) | |
| *H03M 7/30* | (2006.01) | |
| *G06F 7/22* | (2006.01) | |
| *G06F 7/50* | (2006.01) | |
| *G06F 7/523* | (2006.01) | |

(52) U.S. Cl.
CPC .............. *G06N 3/063* (2013.01); *G06F 7/22* (2013.01); *G06F 7/50* (2013.01); *G06F 7/523* (2013.01); *H03M 7/3059* (2013.01); *H03M 7/6064* (2013.01)

(58) Field of Classification Search
CPC .. G06N 3/063; G06F 7/22; G06F 7/50; G06F 7/523; H03M 7/3059; H03M 7/6064
USPC .......................................................... 706/41
See application file for complete search history.

(56) References Cited

U.S. PATENT DOCUMENTS

| | | | | |
|---|---|---|---|---|
| 10,909,728 B1* | 2/2021 | Appalaraju | ............... | G06T 3/40 |
| 2020/0143226 A1* | 5/2020 | Georgiadis | .......... | G06N 3/0481 |
| 2021/0303993 A1* | 9/2021 | Saeedi | ................... | G06N 20/00 |

OTHER PUBLICATIONS

C. Szegedy et al. "Going deeper with convolutions." Proceedings of the IEEE conference on computer vision and pattern recognition, 2015, pp. 1-12.

(Continued)

*Primary Examiner* — Tan V Mai
(74) *Attorney, Agent, or Firm* — Crawford Maunu PLLC

(57) ABSTRACT

Lossy tensor compression and decompression circuits compress and decompress tensor elements based on the values of neighboring tensor elements. The lossy compression circuit scales each decompressed tensor element of a tile by a scaling factor that is based on the maximum value that can be represented by the number of bits used to represent a compressed tensor element, and the greatest value and least value of the tensor elements of the tile. The lossy decompression circuit performs the inverse of the lossy compression. The compression circuit and decompression circuit have parallel multiplier circuits and parallel adder circuits to perform the lossy compression and lossy decompression, respectively.

20 Claims, 7 Drawing Sheets

(56) References Cited

OTHER PUBLICATIONS

A. G. Howard et al. "Mobilenets: Efficient convolutional neural networks for mobile vision applications." arXiv preprint arXiv.: 1704.04861, 2017.
S. Han et al. "Deep compression: Compressing deep neural networks with pruning, trained quantization and huffman coding." arXiv preprint arXiv: 1510.0149, 2015.
H. Li et al. "Pruning filters for efficient convnets." arZiv preprint arXIV: 1608.08710, 2016.
Y. Gong et al. "Compressing deep convolutional networks using vector quantization." arXiv preprint arXiv: 1412.6115, 2014.
M Rhu et al. "Compressing DMA engine: Leveraging activation sparsity for training deep neural networks." Proc. IEEE Intl. Symposium on High Performance Computer Architecture (HPCA), 2018, pp. 78-91.
R. Banner et al. "Post training 4-bit quantization of convolutional networks for rapid-deployment." Advances in Neural Information Processing Systems, 2019, pp. 7948-7956.
S. R. Jain et al. "Trained quantization thresholds for accurate and efficient fixed-point inference of deep neural networks." arXiv:1903.08066, 2019.

\* cited by examiner

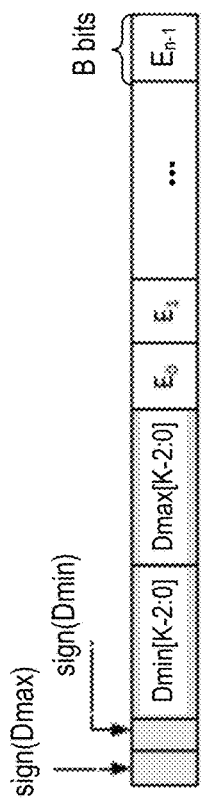
FIG. 5
FIG. 6
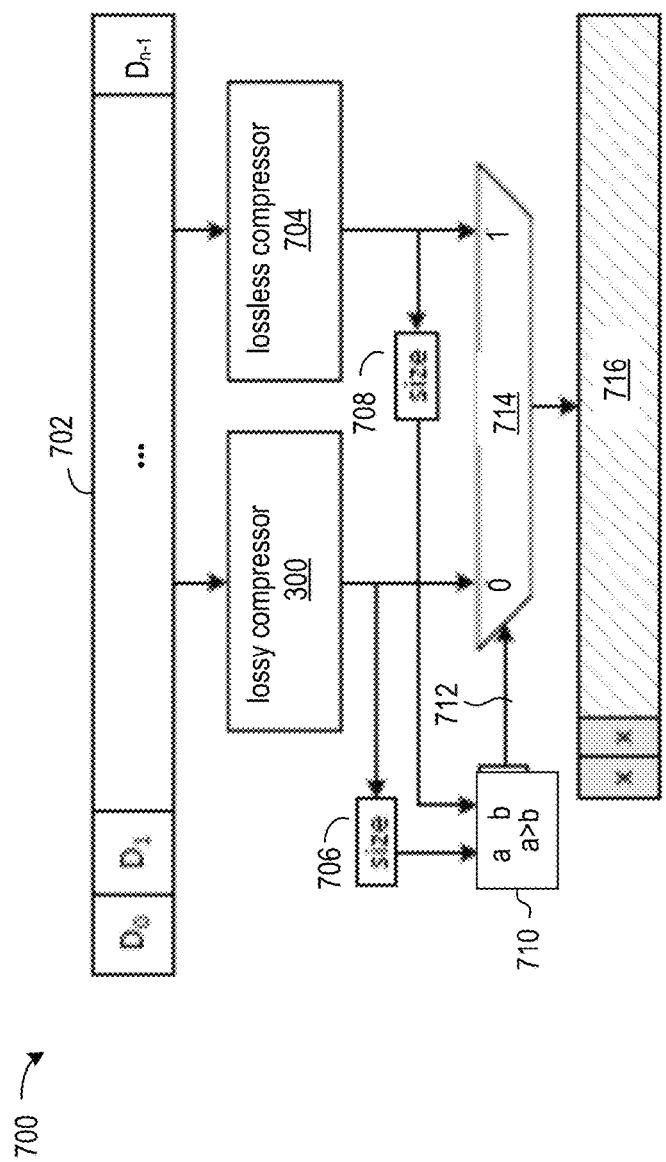
FIG. 7

TENSOR COMPRESSION

TECHNICAL FIELD

The disclosure generally relates to compression of tensors for neural network processing.

BACKGROUND

Large scale neural networks perform computationally intensive operations on large data sets. The computations require substantial computational resources and memory bandwidth in executing multiply accumulate operations involved in convolution operations. Neural network accelerators have been developed to offload computations from processors executing software to hardware structures adapted to perform numerous multiply-and-accumulate operations in parallel.

Neural network accelerators are often implemented as system-on-chips (SoCs) and are generally configured to fetch weights and input tensors to be processed from off-chip memory. A neural network accelerator performs a convolution operation on an input tensor and a set of weights and then stores the output tensor back to memory. To increase computational efficiency, both weights and tensors can be fetched from and/or stored in on-chip memory (e.g. cache) which typically have much higher bandwidth and lower latency than off-chip memory. Unfortunately the amount of on-chip memory is often limited, causing spilling of data to off-chip memory when large tensor and weights are processed and thereby reducing performance.

SUMMARY

A disclosed circuit arrangement includes a min-max circuit that is configured to determine a Dmax and a Dmin of decompressed tensor elements of a tile. Dmax has a greatest value and Dmin has a least value of values of the decompressed tensor elements. Each decompressed tensor element is represented by a first number of bits. The circuit arrangement includes a lossy compressor circuit that is configured to compress each decompressed tensor element of the tile into a respective lossy compressed tensor element that is represented by a second number of bits, B. The lossy compressor circuit is further configured to compress each decompressed tensor element as a function of a maximum value that can be represented by B bits, and a ratio of a difference between a value of the decompressed tensor element and Dmin to a difference between Dmax and Dmin. B is less than the first number of bits. The lossy compression circuit is configured to output Dmax and Dmin in association with the respective lossy compressed tensor elements to a storage circuit.

Another disclosed circuit arrangement includes a first storage circuit that is configured to store a Dmax and a Dmin of decompressed tensor elements of a tile, and compressed tensor elements of the tile that are compressed versions of the of the decompressed tensor elements of the tile. Each of Dmax and Dmin is represented by a first number of bits and each compressed tensor element represented by a second number of bits, B, that is less than the first number of bits. The circuit arrangement further includes a lossy decompressor circuit that is configured to decompress each compressed tensor element of the tile into a first respective decompressed tensor element of the tile that is represented by the first number of bits. The lossy decompressor circuit is further configured to decompress the compressed tensor element into a decompressed tensor element as a function of Dmin, the compressed tensor element, and a ratio of a difference between Dmax and Dmin to a maximum value that can be represented by B bits.

Another circuit arrangement includes memory circuitry configured as a tensor cache and a weight cache. The tensor cache is configured to store a first Dmax and a first Dmin of decompressed tensor elements of an input tile, and compressed tensor elements of the input tile that are compressed versions of the of the decompressed tensor elements of the input tile. Each of the first Dmax and first Dmin is represented by a first number of bits and each compressed tensor element is represented by a second number of bits, B, that is less than the first number of bits. The circuit arrangement further includes a lossy decompressor circuit that is configured to decompress each compressed tensor element of the input tile into a first respective decompressed tensor element of the input tile that is represented by the first number of bits. The lossy decompressor circuit is further configured to decompress the compressed tensor element into a decompressed tensor element represented by the first number of bits as a function of the first Dmin, the compressed tensor element, and a ratio of a difference between the first Dmax and the first Dmin to a maximum value that can be represented by B bits. The circuit arrangement further includes a tensor processor coupled to input weights from the weight cache and the decompressed tensor elements. The tensor processor is configured to generate output tensor elements as a function of the decompressed tensor elements and weights. The circuit arrangement further includes a min-max circuit that is configured to determine a second Dmax and a second Dmin of decompressed tensor elements of an output tile. The circuit arrangement includes a lossy compressor circuit configured to compress each decompressed tensor element of the output tile into a respective lossy compressed tensor element that is represented by B bits. The lossy compressor circuit is further configured to compress each decompressed tensor element of the output tile as a function of a maximum value that can be represented by B bits, and a ratio of a difference between a value of the decompressed tensor element and the second Dmin to a difference between the second Dmax and the second Dmin. The lossy compression circuit is configured to output the second Dmax and the second Dmin in association with the respective lossy compressed tensor elements to a storage circuit.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which:

FIG. 5 shows the format of a lossy compressed tensor tile;

FIG. 6 shows the format of a losslessly compressed tensor tile;

FIG. 7 shows an exemplary circuit arrangement that semi-lossy compresses a tile of tensor elements;

DETAILED DESCRIPTION

Figure 1:
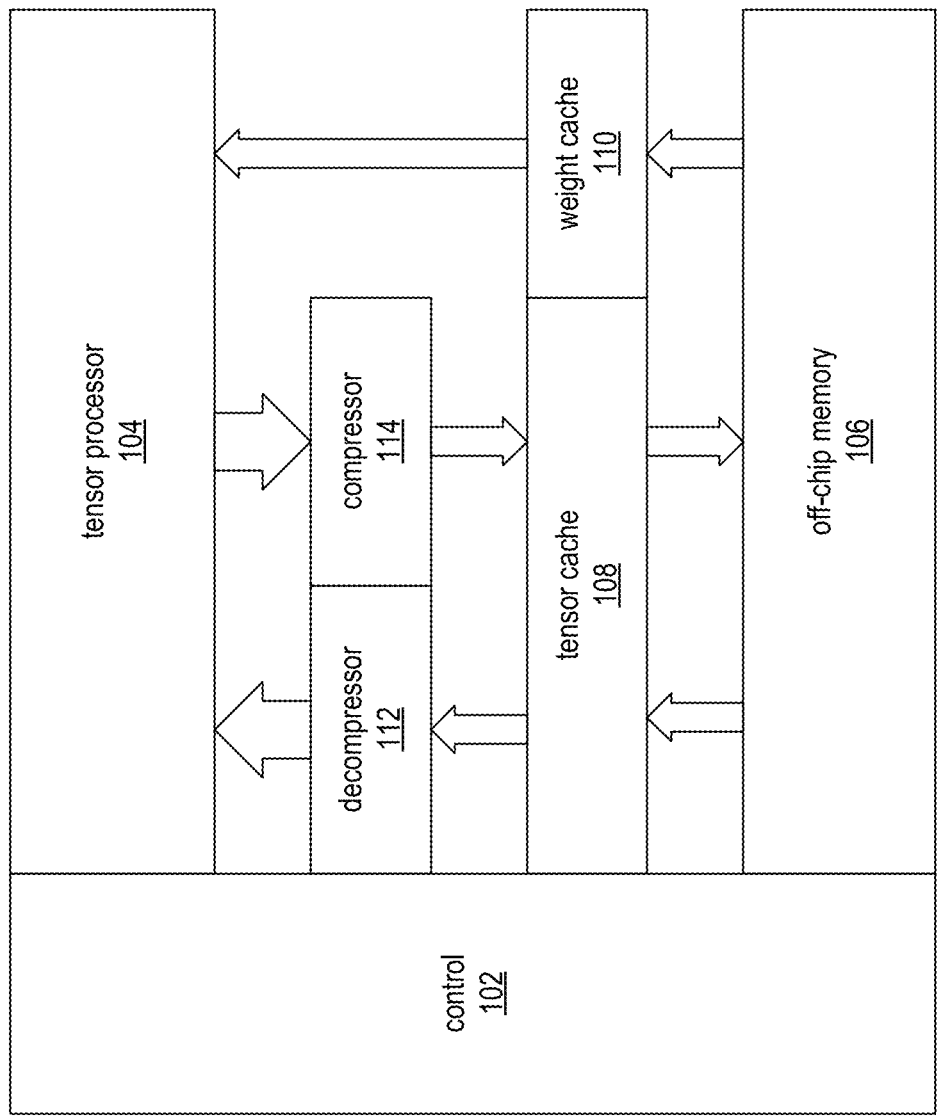
FIG. 1 shows a circuit arrangement for tensor processing in which tensor elements are lossy decompressed and compressed according to the disclosed approaches.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to prevent obscuring the description of the examples herein. For ease of illustration, the same reference numerals may be used in different diagrams to refer to the same elements or additional instances of the same element.

Though lossless compression reduces storage requirements for individual tensor elements with no loss of inference accuracy, cache storage requirements may not be significantly reduced. Examples of lossless compression include Huffman coding, run length encoding, zero-value compression (ZVC). Lossless compression of tensors presents at least two obstacles.

Lossless compression does not increase the effective cache size (allowing storage of a greater number of tensor elements), particularly for statically scheduled neural network accelerators. While lossless compression can reduce the average size of tensors, the size of a compressed tensor is not deterministic and is unknown until runtime. Thus, statically scheduled neural network accelerators allocate cache storage for a worst-case scenario, which is at least the size of an uncompressed tensor. As a result, lossless compression can increase the effective memory bandwidth, but does not increase the quantity of data that can be cached on chip. Consequently, memory spilling behavior would be similar to that of an uncompressed implementation.

Another drawback to lossless compression of tensors is that lossless compression can result in less-than-ideal random access patterns to tensor data. Support for random accesses into a block of tensor elements requires significant complexity as the size of compressed tensors is unknown until run-time and changes between blocks of tensor data. Unfortunately, support for random accesses into a block of tensor data is important as a block is usually split and processed among numerous processor cores in high performance neural network accelerators.

Some lossless compression methods, such as ZVC, may be unsuitable for increasing cache resources in implementing different neural networks. ZVC achieves good compression ratios (on average) by exploiting the fact that the ReLU activation function sets a significant number of tensor elements to zero. However, ZVC would be unsuitable for a neural network that does not set a significant number of tensor elements to zero, such as leaky ReLU. Though ZVC may be suitable for compressing DMA PCIE transfers, ZVC would not increase memory/cache capacity and/or memory/cache bandwidth for all neural networks.

The disclosed approaches to improving computational efficiency of convolution processing of large tensors involve lossy tensor compression, which can be optionally employed in combination with increasing on-chip memory capacity, increasing on-chip memory bandwidth, and/or increasing off-chip memory bandwidth. Lossy tensor compression effectively increases on-chip memory capacity and on-chip/off-chip memory bandwidth. According to the disclosed circuits and methods, decompression and compression circuits are configured in the data pipeline of the neural network accelerator.

The disclosed approaches employ efficient lossy compression and decompression of tensors by exploiting correlation between values of neighboring tensor elements. The disclosed approaches provide a deterministic compression ratio, make efficient use of circuit resources in compressing and decompressing, and are compatible with ReLU and other activation functions that do not involve sparse activation outputs.

Typical tensors are four dimensional, including a batch size dimension, a width dimension, a height dimension, and a channel dimension. Since data along the batch size dimension and channel dimension correspond to different batches and different filter outputs, data along those dimensions can be processed independently. Thus, without loss of generality, input to the compressor and decompressor circuits can be processed as a two-dimensional ("2D") tensor having width and height dimensions. The disclosed circuits and methods can be applied to 1D, 2D, 3D, . . . tensors that can be divided into blocks of tensor elements for compression. Each block of tensor elements is a subset of the tensor elements of the tensor, and the tensor elements of the block are neighboring elements.

According to a neural network processing system configured with compression and decompression circuits as disclosed herein, input tensors are assumed to be in a lossy (or semi-lossy) compressed format, and the compressed tensor data can be stored in a tensor cache for processing by a tensor processor. A decompressor circuit is configured to decompress the compressed tensor data from the tensor cache for processing by the tensor processor, and a compressor circuit is configured to compress the output tensor data from the tensor processor for storage in the tensor cache.

The lossy compressed data of a tensor in the disclosed lossy compressed format includes multiple compressed "tiles." The tensor data in the decompressed format (or "decompressed tensor elements") can be viewed as including multiple decompressed tiles, which comprise a decompressed tensor. Each tile includes a group of neighboring tensor elements of the tensor. A compressed tile also includes "Dmin" and "Dmax" values in decompressed format, which are the least and greatest values of tensor element in the tile, respectively.

The compressor circuit determines Dmin and Dmax of an input tile, generates a scaled value for each tensor element in the tile, and rounds the scaled value to a value represented by the number of bits (B) of the compressed tensor element. The scaled value for each tensor element is generated based on the maximum value ($2^B-1$) that can be represented by the number of bits used to represent a compressed tensor element, and a ratio of the difference between the value of the decompressed tensor element and Dmin (x−Dmin) to the difference between Dmax and Dmin (Dmax−Dmin). The compressor circuit outputs, Dmin and Dmax in association with compressed tensor elements of the tile. Dmin and Dmax are stored in decompressed format in association with the compressed tensor elements.

The decompressor circuit performs the inverse operation of the compressor circuit in decompressing compressed tensor elements of a tile. As described above, the format of compressed tensor elements includes the Dmin and Dmax of a tile in decompressed format. The decompressor circuit inputs Dmin, Dmax and the associated lossy compressed tensor elements of a tile. The decompressor circuit decompresses each of the compressed tensor elements into a respective decompressed tensor element that is represented by the number of bits of the decompressed format. The decompression involves computing the decompressed tensor element as a function of Dmin, the compressed tensor element, and a ratio of a difference between Dmax and Dmin to a maximum value that can be represented by the number of bits used to represent a compressed tensor element.

FIG. 1 shows a circuit arrangement 100 for tensor processing in which tensor elements are lossy decompressed and compressed according to the disclosed approaches. The directional lines illustrate the flow of data, and the relative widths of the directional lines represent the compressed and decompressed states of the tensor data. Wide directional lines represent decompressed tensor data, and narrow directional lines represent compressed tensor data. The circuit arrangement includes control logic 102, tensor processor 104, off-chip memory 106, tensor cache 108, weight cache 110, decompressor circuit 112, and compressor circuit 114.

Control logic 102 can control the movement of tensor data and direct the sequencing of tensor operations on the tensor data. The control logic can include bus control circuits, DMA control circuits, tensor processing instructions, etc. The control logic can be distributed amongst the tensor processor 104, off-chip memory 106, tensor cache 108 and weight cache 110, decompressor circuit 112, and compressor circuit 114.

The circuit arrangement 100 can include a system-on-chip (SoC) on which the tensor processor 104, tensor cache 108, weight cache 110, decompressor circuit 112, and compressor circuit 114 are implemented. Convolution operations of the tensor processor 104 can be implemented by an array of multiply-and-accumulate (MAC) circuits of the SoC, and arithmetic operations of the decompressor circuit 112 and compressor circuit can be implemented by MAC circuits of the SoC. Functions of the tensor processor 104, tensor cache 108, weight cache 110, decompressor circuit 112, and compressor circuit 114 can be implemented in programmable logic, such as field programmable gate array (FPGA) circuitry, of the SoC. As used herein, SoC also refers to a system-in-package (SiP). The tensor cache 108 and weight cache 110 can be implemented using on-chip memory resources.

Tensors to be processed are stored in compressed form in the off-chip memory 106. The tensor data can be lossy compressed or semi-lossy compressed as described elsewhere in the disclosure. Input tensor data can be compressed by a pre-processing compression circuit (not shown) that compresses the tensor data according to the disclosed approaches, and provides the compressed tensor data in the off-chip memory. Similarly, final output tensor data is stored in compressed form in the off-chip memory and can be decompressed by a post-processing decompression circuit (not shown) according to the disclosed approaches. The pre-processing compression circuit and post-processing decompression circuit can be implemented by circuits consistent with the compressor and decompressor circuits disclosed herein or alternatively by a programmed processor, such as a CPU, GPU, or RISC processor, for example.

The input compressed tensor elements in the off-chip memory 106 are cached in the tensor cache memory 108 and weights are cached in weight cache memory 110 for convolution processing by the tensor processor 104. The decompressor circuit 112 decompresses the compressed tensor elements from the tensor cache for input to the tensor processor 104. The compressor circuit 114 compresses output tensor elements generated by the tensor processor 104 for storage in the tensor cache 108. The decompressor circuit 112 can be configured to decompress tensor elements that are lossy compressed or semi-lossy compressed tensor elements, and the compressor circuit 114 can be configured to lossy or semi-lossy compress tensor elements as described herein.

The decompressor circuit 112 and compressor circuit 114 can be disposed at stages of the data pipeline other than the stages shown in FIG. 1. For example, as the input tensor data is stored in compressed format in the off-chip memory 106, the decompressor circuit 112 and compressor circuit 114 could alternatively be disposed between the off-chip memory 106 and the tensor cache 108 and implemented in programmable logic circuitry of the SoC. The configuration would effectively increase memory bandwidth and improve performance. However, the configuration would not reduce storage requirements of the tensor cache.

In another configuration, the decompressor circuit 112 and compressor circuit 114 could be integrated as fixed-function circuitry within the tensor processor 104. Integrating the decompressor circuit 112 and the compressor circuit 114 within the tensor processor 104 would also increase internal memory bandwidth/capacity of the tensor cache 108. However, the fixed-function MAC circuitry would require modifications.

The configuration shown in FIG. 1 can be a reasonable compromise that increases the bandwidth of the tensor cache 108 and off-chip memory 106 without requiring logic changes to the tensor processor 104.

Figure 2:
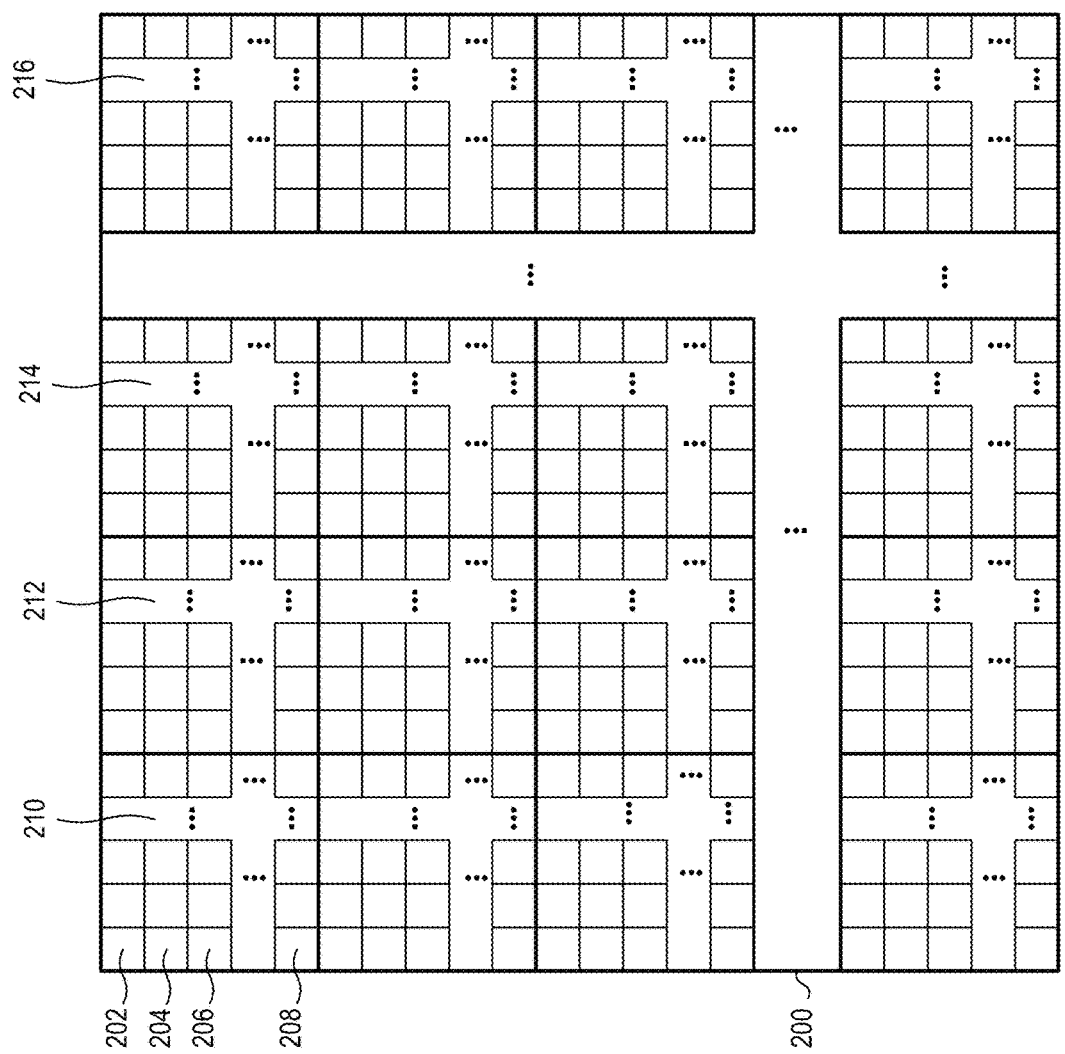
FIG. 2 shows an exemplary input tensor divided into tiles for lossy compression.

FIG. 2 shows an exemplary input tensor 200 divided into tiles for lossy compression. Blocks 202, 204, 206, and 208 represent tensor elements, and blocks 210, 212, 214, and 216 are examples of tiles of the tensor. The tensor may be padded at the edges if needed to evenly divide the tensor into tiles having height DH and width Dw. The tensor elements within a tile are neighboring tensor elements, and the disclosed lossy compression uses values of the neighboring tensor elements to compress each tensor element in the tile into a B-bit value.

The size of each tile can be sized and shaped according to application requirements. For applications in which retraining is feasible, 8×8 tiles may be suitable. Tiles of size 4×4 can generally work well. For applications in which retraining is not feasible, tiles of size 4×2 or 2×4 may be suitable.

In some applications, the tensor processor may need elements of tensor 200 that occupy parts of tiles 210 and 212. In other words, the boundaries of the tile needed by the tensor processor may not coincide with the boundaries of a single one of the tiles having compressed tensor elements This scenario would involve decompression of both tiles 210 and 212 to obtain the desired decompressed tensor elements. In some implementations, the tensor processor can track which tensor elements of the decompressed tiles 210 and 212 are needed for the desired tensor elements.

In other implementations the tensor processor may be unequipped to track decompressed tensor elements of the desired tile to decompressed tensor elements of the tiles 210 and 212. In this scenario, an intermediate buffer (not shown) can be disposed between the decompressor circuit 112 (FIG. 1) and the tensor processor, and a reconstruction buffer (not shown) can be disposed between the tensor processor and the compressor circuit. The decompressor circuit can decompress both tiles 210 and 212 and store the decompressed tensor element in the intermediate buffer for consumption by the tensor processor. Similarly, if the tensor processor generates a tile of tensor elements that constitutes parts of two tiles to be compressed, the tensor elements can be stored in the reconstruction buffer to compress once all the tensor elements needed to compress a tile are present.

Figure 3:
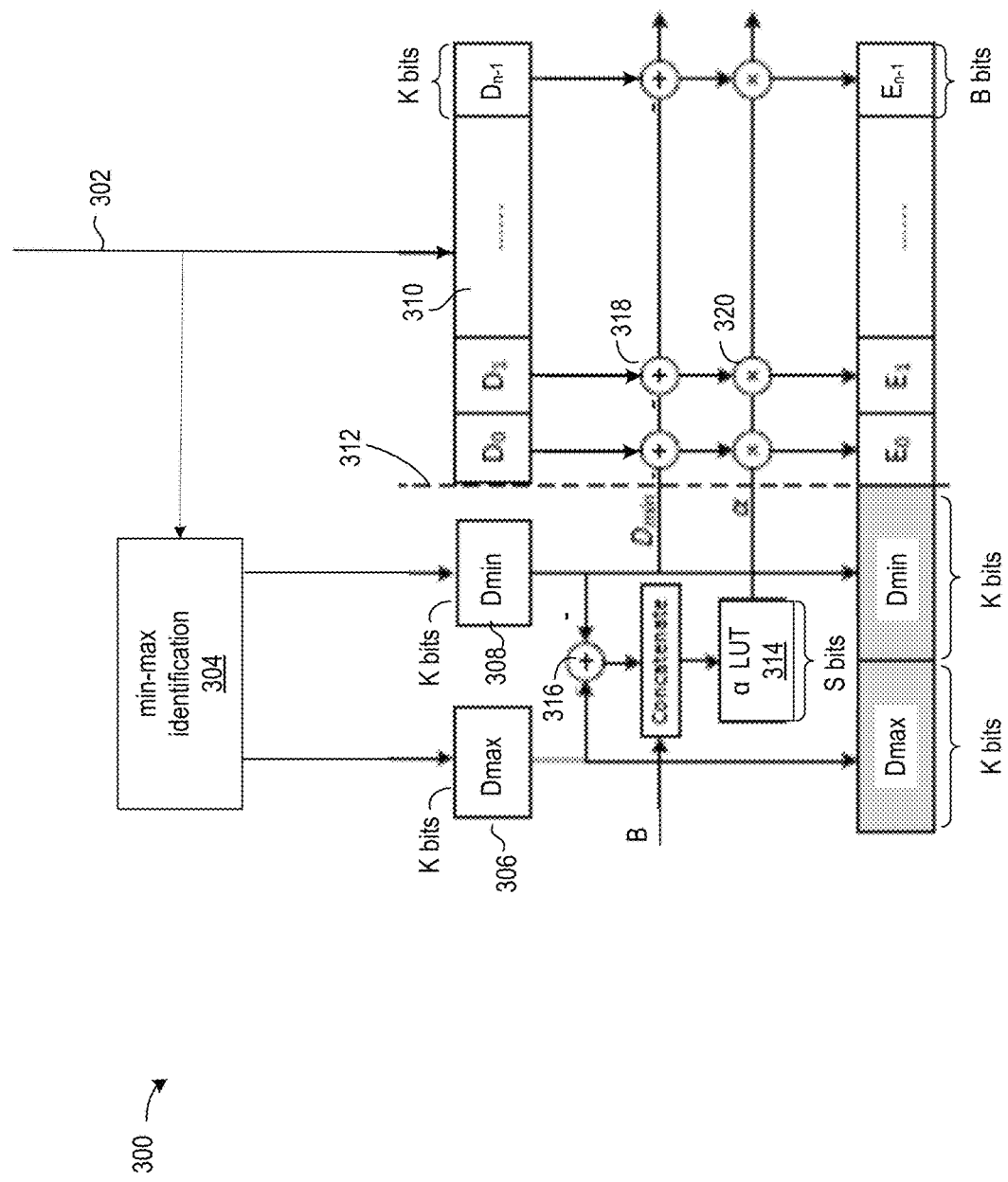
FIG. 3 shows an exemplary lossy compressor circuit.

FIG. 3 shows an exemplary lossy compressor circuit 300. Generally, the compressor circuit compresses each decompressed tensor element of a tile into a respective lossy compressed tensor element of B bits based on the value of the decompressed tensor element relative to the minimum value (Dmin) and maximum value (Dmax) of the tensor elements in the tile and a maximum value that can be represented by B bits (i.e., $2^B-1$). More specifically, the lossy compressed value of a tensor element, x, is a value, which is rounded to B bits, produced by a function of the maximum value that can be represented by B bits (i.e., $2^B-1$), and a ratio of the difference between the value of the decompressed tensor element and Dmin to a difference between Dmax and Dmin. The lossy compression function can be expressed as follows:

$$f(x) = \left\lfloor \frac{x - D_{min}}{D_{max} - D_{min}} \cdot (2^B - 1) \right\rfloor$$

To simplify the computation and improve performance, a scale factor can be factored out of the computation, because the same scale factor is used to compress all tensor elements in the tile. The scale factor $\alpha$ is:

$\alpha = (2^B-1)/(D\text{max}-D\text{min})$

The simplified lossy compression function is:

$f(x) = \lfloor \alpha(x - D\text{min}) \rfloor$

A tile of tensor elements, denoted $[D_0, D_1, \ldots, D_{n-1}]$, is input to the compressor circuit 300 on signal line 302. Each of the decompressed tensor elements is K bits. The min-max identification circuit 304 inputs the tensor elements of the tile and determines the minimum value (Dmin) and maximum value (Dmax) of the tensor elements in the tile and stores the decompressed values of Dmin and Dmax in registers 306 and 308. The entire tile is also captured in registers 310.

The part of the compressor circuit to the left of the dashed line 312 generates the scaling factor $\alpha$, and the part of the compressor circuit to the right of the dashed line 312 compresses the input tensor elements using the scaling factor, Dmin, and the values of the tensor elements.

In an exemplary implementation, the scaling factor $\alpha$ is obtained from a lookup memory 314. The lookup memory is configured with all possible values of a $((2^B-1)/(MAX_D-MIN_D))$, where $MAX_D$ is the maximum possible value of a tensor element, and $MIN_D$ is the minimum possible value of a tensor element. In some compressors, the lookup memory can be configured with multiple sets of scaling factors for different compression levels (i.e., B=1 bit, B=2 bits, B=3 bits, . . . ). The number of scaling factors associated with each compression level is the number of possible values of $(MAX_D-MIN_D)$, which is essentially a function of the number of bits used to represent $MAX_D$ and $MIN_D$, (e.g., $2^K-1$).

For an implementation involving a single value of B, the lookup memory is addressed by the difference between Dmax and Dmin in the input tile. Adder circuit 316 computes Dmax−Dmin, and the difference can address the lookup memory 314. In an implementation that supports different values of B, the lookup memory is additionally addressed by bits that indicate the group of scaling factors for the desired compression level such as by concatenating bits that represent the value of B and the computed difference from adder 316. The address resulting from the concatenation can be an offset into the lookup memory.

Parallel adder circuits and parallel multiplier circuits compute the lossy compressed tensor elements $E_0, E_1, \ldots, E_{n-1}$ from the decompressed tensor elements $D_0, D_1, \ldots, D_{n-1}$. Each of the adder circuits computes the difference between Di and Dmin ($D_i$−Dmin for $0 \le i \le n-1$). For example, adder circuit 318 computes ($D_1$−Dmin). Dmin is input in parallel to the adder circuits. Each of the multiplier circuits is coupled to the output of a corresponding one of the adder circuits and computes the product of $\alpha(D_i-$Dmin$)$. For example, multiplier circuit 320 computes $\alpha(D_1-$Dmin$)$. The scaling factor is input in parallel to the multiplier circuits. The adder circuits operate in parallel as do the multiplier circuits. The adder circuits and multiplier circuits can be implemented, for example, by DSP58 or DSP48 (digital signal processing) circuits that are available in some Xilinx FPGAs and SoCs.

In implementations involving DSP circuits as the adder circuits, the DSP circuits are configurable to perform subtraction. In implementations involving programmable logic-implemented adders, a sign inversion circuit can invert the sign of the input. The DSP circuits can be configured to round or truncate the output of the multiplications according to application objectives.

The compressed tensor elements $E_0, E_1, \ldots, E_{n-1}$ of a tile are stored in association with the decompressed Dmax and Dmin (each K bits) of the tile as a vector in order to make Dmax and Dmin available to decompress the tensor elements of the tile. The vectors of each compressed tensor can be output on a data bus and stored in a tensor cache memory or off-chip memory.

Figure 4:
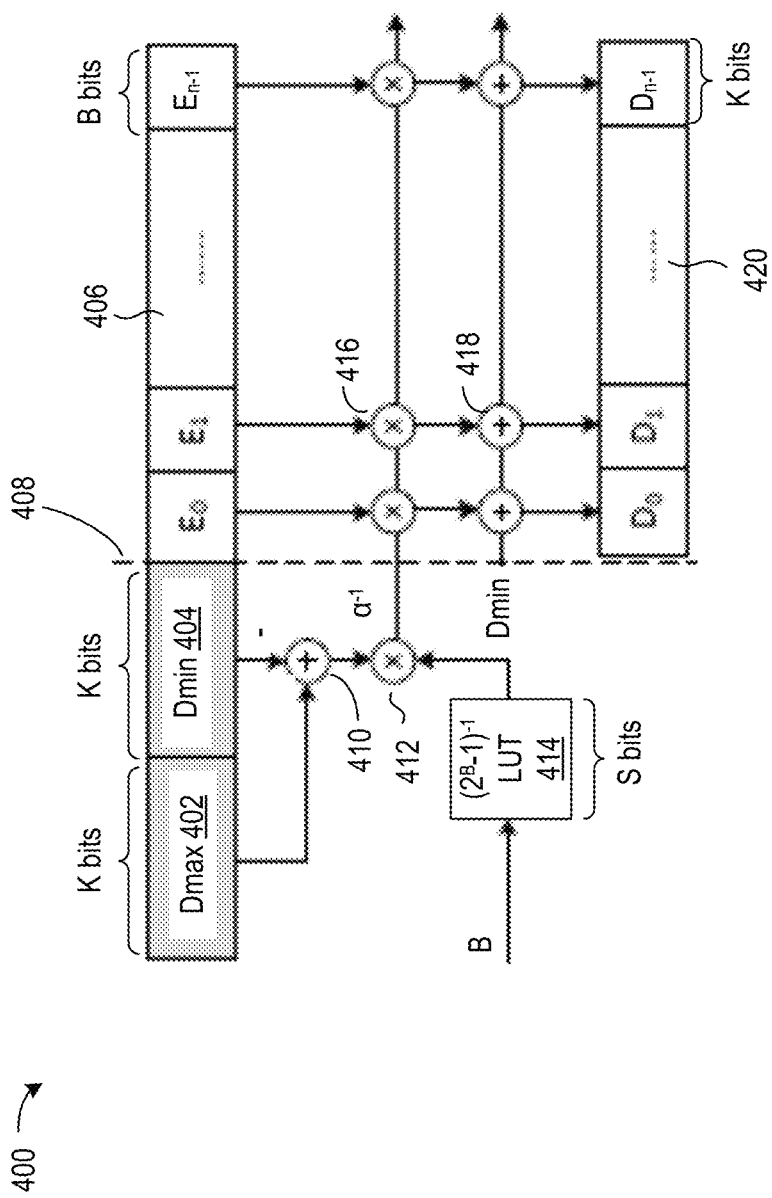
FIG. 4 shows an exemplary lossy decompression circuit.

FIG. 4 shows an exemplary lossy decompression circuit 400. Generally, the decompressor circuit decompresses each compressed tensor element of a tile into a respective decompressed tensor element of K bits using the inverse of the compression function.

Generally, the lossy decompressor circuit decompresses each compressed tensor element as a function of Dmin, the compressed tensor element, and a ratio of a difference between Dmax and Dmin to a maximum value that can be represented by B bits. The lossy decompression function of the value of a lossy compressed tensor element y of a tile can be expressed as follows:

$$g(y) = \frac{(D_{max} - D_{min})}{2^B - 1} y + D_{min}$$

Dmax and Dmin are the decompressed values of the greatest and least values of the tensor elements of the tile, respectively.

To simplify the computation and improve performance, an inverse scale factor, $\alpha^{-1}$, can be factored out of the decompression computation.

$\alpha^{-1} = (D\text{max}-D\text{min})/(2^B-1)$

The difference between Dmax and Dmin will vary from tile to tile. However, the value of $(2^B-1)^{-1}$ will be a constant if a single value of B is supported or one of a few values if multiple values of B are supported. The same inverse scale factor can be used to decompress all the tensor elements in the tile.

The decompression function expressed using the inverse scaling factor is:

$\alpha^{-1}y + D_{min}$

The decompressor circuit 400 inputs a vector denoted [Dmin, Dmax, $E_0, E_1, \ldots, E_{n-1}$] from storage circuits that can include registers 402 and 404 for storage of the decompressed values of Dmax and Dmin, and registers 406 that store the lossy compressed tensor elements $E_0, E_1, \ldots, E_{n-1}$ of a tile. Dmax and Dmin are each represented by K bits, and each of $E_0, E_1, \ldots, E_{n-1}$ is represented by B bits as described above.

The portion of the decompressor circuit 400 to the left of dashed line 408 computes $\alpha^{-1}$, which is used by the portion of the decompressor circuit to the right of the dashed line to compute $g(E_k)$ for $0 \le k \le n-1$ in parallel using parallel MAC circuits, such as the DSP58 circuit in Xilinx FPGAs.

Adder circuit 410 computes the difference between Dmax and Dmin, and multiplier circuit 412 computes $\alpha^{-1}=(\text{Dmax}-\text{Dmin})*(2^B-1)^{-1}$. The value of $(2B-1)^{-1}$ can be provided as a constant value from a register (not shown) in an implementation that supports a single value of B. In an implementation that supports selection of one of multiple values of B, the value of B can be input to lookup memory circuit 414, which outputs the addressed value of $(2^B-1)^{-1}$, which can be referred to as the "reciprocal bit count."

Parallel multiplier circuits and parallel adder circuits compute the lossy decompressed tensor elements $D_0, D_1, \ldots, D_{n-1}$ from the compressed tensor elements $E_0, E_1, \ldots, E_{n-1}$. Each of the multiplier circuits computes the product of ($\alpha^{-1}*E_i$ for $0 \le i \le n-1$). For example, multiplier circuit 416 computes $\alpha^{-1}*E_1$. The inverse scaling factor is input in parallel to the multiplier circuits. Each of the adder circuits is coupled to the output of a corresponding one of the multiplier circuits and computes the sum of Dmin and the inverse-scaled compressed tensor element ($\alpha^{-1}*E_i$+Dmin for $0 \le i \le n-1$). For example, adder circuit 418 computes ($\alpha^{-1}*E_1$+Dmin). Dmin is input in parallel to the adder circuits. The adder circuits operate in parallel as do the multiplier circuits. The adder circuits and multiplier circuits can be implemented, for example, by DSP58 circuits that are available in some Xilinx FPGAs and SoCs. The decompressed tensor tile can be output on a data bus for processing by a tensor processor or staged in storage registers 420.

To improve performance of lossy tensor compression, another approach combines the benefits of lossless compression with the benefits of lossy compression. The combined approach is referred to as "semi-lossy" compression. The semi-lossy compression approach compresses each tile of an input tensor using both a lossless scheme and the disclosed lossy scheme. The two compressions are performed in parallel, and the semi-lossy compression circuit selects either the losslessly compressed tile or the lossy compressed tile. Between the two compressed tiles, the lossless scheme is selected unless the compression ratio of the lossy scheme is larger. The compression ratio can be deterministic by combining lossless and lossy compression. The potential for loss of inference accuracy is reduced by using lossless compression as often as possible.

The format of compressed tensor tiles indicates whether a tile is losslessly or lossy compressed in order to signal to the decompression circuit whether to select lossless or lossy decompression. FIGS. 5 and 6 show the formats of a lossy compressed tensor tile and a losslessly compressed tensor tile, respectively.

FIG. 5 shows the format of a lossy compressed tensor tile. The fact that Dmin Dmax in lossy compression is advantageously used to identify tiles that are lossy compressed versus losslessly compressed. For lossy compressed tiles, the sign bits of the Dmax and Dmin are moved to the first two bits of the vector as shown in FIG. 5. The sign bit of Dmax is placed in the left-most position, and the sign bit of Dmin is placed in the next position to the right.

FIG. 6 shows the format of a losslessly compressed tile. When a tile is losslessly compressed, bits valued "10" are placed in left-most bits of the vector as shown in FIG. 6. A lossy compressed tensor will never have bits "10" in those bit positions, because Dmin≤Dmax in lossy compression. Therefore, in response to the left-most bits being "10," the decompressor circuit selects the losslessly decompressed tile.

FIG. 7 shows an exemplary circuit arrangement 700 that semi-lossy compresses a tile of tensor elements. The circuit inputs at tile of decompressed tensor elements $D_0, D_1, \ldots, D_{n-1}$ from storage circuit 702. The lossy compressor circuit 300 and lossless compressor circuit 704 compress the input tile of tensor elements in parallel with one another. The lossy compressor circuit lossy compresses the input tile of tensor elements as shown in FIG. 3 and described herein. The lossless compressor circuit 704 can be any one of a variety of lossless compression approaches. For discussion purposes and without loss of generality, the lossless compressor circuit is assumed to implement ZVC ((and lossless decompressor circuit of FIG. 8 is assumed to be compatible).

The size circuits 706 and 708 can operate as an evaluation circuit that evaluates the compression levels of the compressed tile produced by the lossy compressor circuit 300 and the lossless compressor circuit 704, respectively. Size circuit 706 determines the size of the compressed tile generated by lossy compressor circuit 300, and size circuit 708 determines the size of the compressed tile generated by lossless compressor circuit 704. Comparison circuit 710 compares the size of the lossy compressed tile to the size of the losslessly compressed tile and generates a control signal 712 to selection circuit 714. In response to the size of the lossy compressed tile being greater than the size of the losslessly compressed tile, the generated control signal 712 causes the selector circuit 714 to select the losslessly compressed tile for output to storage circuit 716. Otherwise, the generated control signal 712 causes the selector circuit 714 to select the lossy compressed tile.

The implementation of the size circuits 706 and 708 can vary according to the lossless compression scheme implemented by the lossless compressor circuit 704. For example, if the ZVC compression is implemented, the size circuit 708 can determine the number of 0 values in the compressed tile. The comparison circuit 710 can signal that the output of the lossy compressor circuit 300 should be selected in response to the size circuit 708 indicating the number of zeros within a tile is greater than a threshold value, which can be predetermined based on the size of the tile.

Figure 8:
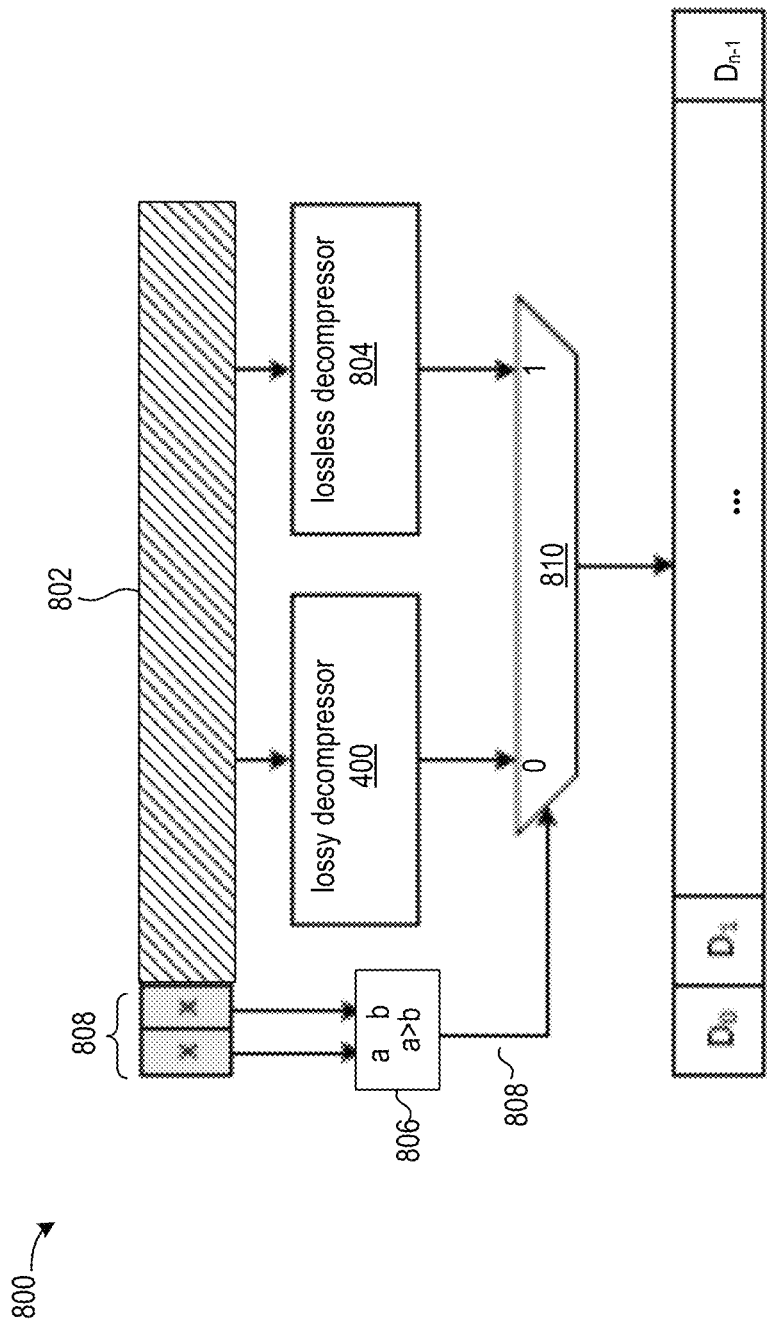
FIG. 8 shows an exemplary circuit arrangement that provides semi-lossy decompression of tensor elements.

FIG. 8 shows an exemplary circuit arrangement 800 that provides semi-lossy decompression of tensor elements. The semi-lossy decompressor circuit 800 inputs a compressed tensor tile from storage circuit 802. The lossy decompressor circuit 400 performs lossy decompression of the compressed tensor tile as shown in FIG. 4 and described herein. In parallel with the lossy decompression, the lossless decompressor circuit 804 losslessly decompresses the compressed tile.

The format detection circuit 806 determines whether the compressed tile is lossy compressed or losslessly compressed based on the value of the format code 808 specified in the left-most two bits of the tile. In response to the a-bit of the format code being greater than the b-bit of the format code (i.e., bits "10" in the left-most bits), the format detection circuit generates a control signal 809 to the selector circuit 810 to select the decompressed tile from lossless decompressor circuit 804. Otherwise, the format detection circuit generates the control signal to select the decompressed tile from lossy decompressor circuit 400.

In other approaches, tensor decompression and compression may not provide a recognizable benefit, and tensors can be selectively decompressed and compressed. For small tensors, the tensor cache (and even in some cases off-chip memory) often have sufficient capacity and bandwidth, and tensor compression is not beneficial. A compiler can use a performance model and determine prior to runtime which tensors should be compressed and which tensors should not. Forgoing compression of tensors in some layers can significantly reduce the negative impacts on inference accuracy. The decompressed tensor tile can be output on a data bus for processing by a tensor processor or staged in storage registers.

Figure 9:
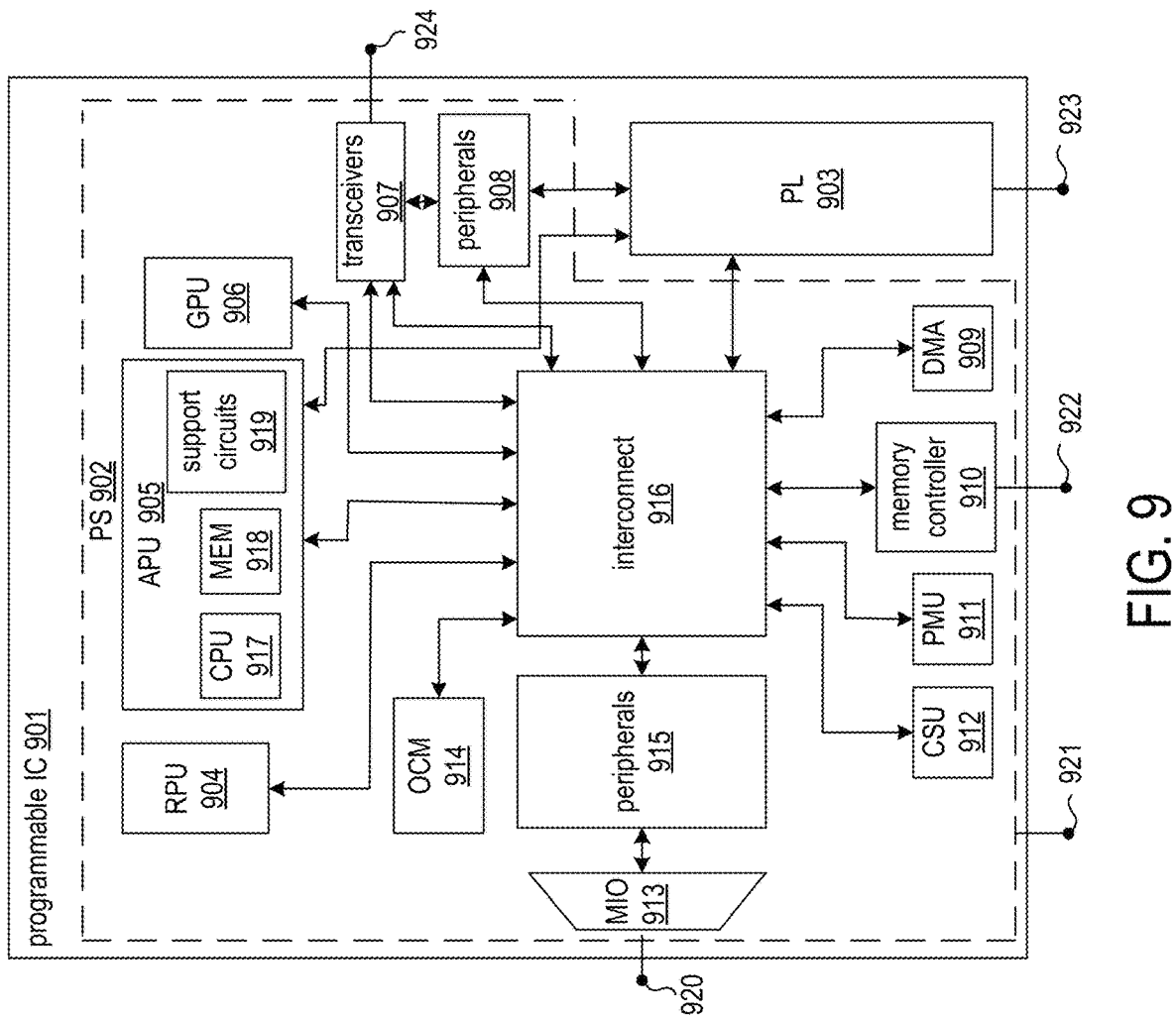
FIG. 9 is a block diagram depicting an exemplary System-on-Chip (SoC) that can host the disclosed tensor compression/decompression circuits, tensor processing, and tensor cache circuits.

FIG. 9 is a block diagram depicting an exemplary System-on-Chip (SoC) 901 that can host the disclosed tensor compression/decompression circuits, tensor processing, and tensor cache circuits. In the example, the SoC includes the processing subsystem (PS) 902 and the programmable logic subsystem 903. The processing subsystem 902 includes various processing units, such as a real-time processing unit (RPU) 904, an application processing unit (APU) 905, a graphics processing unit (GPU) 906, a configuration and security unit (CSU) 912, and a platform management unit (PMU) 911. The PS 902 also includes various support circuits, such as on-chip memory (OCM) 914, transceivers 907, peripherals 908, interconnect 916, DMA circuit 909, memory controller 910, peripherals 915, and multiplexed (MIO) circuit 913. The processing units and the support circuits are interconnected by the interconnect 916. The PL subsystem 903 is also coupled to the interconnect 916. The transceivers 907 are coupled to external pins 924. The PL 903 is coupled to external pins 923. The memory controller 910 is coupled to external pins 922. The MIO 913 is coupled to external pins 920. The PS 902 is generally coupled to external pins 921. The APU 905 can include a CPU 917, memory 918, and support circuits 919. The APU 905 can include other circuitry, including L1 and L2 caches and the like. The RPU 904 can include additional circuitry, such as L1 caches and the like. The interconnect 916 can include cache-coherent interconnect or the like.

Referring to the PS 902, each of the processing units includes one or more central processing units (CPUs) and associated circuits, such as memories, interrupt controllers, direct memory access (DMA) controllers, memory management units (MMUs), floating point units (FPUs), and the like. The interconnect 916 includes various switches, busses, communication links, and the like configured to interconnect the processing units, as well as interconnect the other components in the PS 902 to the processing units.

The OCM 914 includes one or more RAM modules, which can be distributed throughout the PS 902. For example, the OCM 914 can include battery backed RAM (BBRAM), tightly coupled memory (TCM), and the like. The memory controller 910 can include a DRAM interface for accessing external DRAM. The peripherals 908, 915 can include one or more components that provide an interface to the PS 902. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 915 can be coupled to the MIO 913. The peripherals 908 can be coupled to the transceivers 907. The transceivers 907 can include serializer/deserializer (SERDES) circuits, MGTs, and the like.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for tensor processing. Other aspects and features will be apparent to those skilled in the art from consideration of the specification. The circuits and methods can be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement, comprising:
a min-max circuit configured to determine a Dmax and a Dmin of decompressed tensor elements of a tile, Dmax having a greatest value and Dmin having a least value of values of the decompressed tensor elements, each decompressed tensor element represented by a first number of bits; and
a lossy compressor circuit configured to compress each decompressed tensor element of the tile into a respective lossy compressed tensor element that is represented by a second number of bits, B, the lossy compressor circuit configured to:
compress each decompressed tensor element as a function of a maximum value that can be represented by B bits, and a ratio of a difference between a value of the decompressed tensor element and Dmin to a difference between Dmax and Dmin, wherein B is less than the first number of bits, and
output Dmax and Dmin in association with the respective lossy compressed tensor elements to a storage circuit.

2. The circuit arrangement of claim 1, wherein the lossy compressor circuit includes:
a plurality of adder circuits configured to compute respective differences in parallel between the values of the decompressed tensor elements and Dmin; and
a plurality of multiplier circuits configured to compute in parallel respective products of the respective differences and a scaling factor.

3. The circuit arrangement of claim 2, further comprising:
another adder circuit configured to compute the difference between Dmax and Dmin; and
wherein the scaling factor is equal to $(2^B-1)/$(the difference between Dmax and Dmin).

4. The circuit arrangement of claim 2, wherein each multiplier circuit is configured to round one of the respective products to a value represented by B bits.

5. The circuit arrangement of claim 2, further comprising:
another adder circuit configured to compute the difference between Dmax and Dmin;
a lookup memory coupled to the other adder circuit and addressed by the difference between Dmax and Dmin; and
wherein the lookup memory is configured to output the scaling factor that is one scaling factor of a plurality of scaling factors in response to the difference between Dmax and Dmin.

6. The circuit arrangement of claim 1, further comprising:
a lossless compressor circuit configured to compress the decompressed tensor elements of the tile into a lossless-compressed tile; and
a selector circuit configured to select and output either the respective lossy compressed tensor elements or the lossless-compressed tile.

7. The circuit arrangement of claim 6, further comprising:
an evaluation circuit coupled to the lossy compressor circuit and to the lossless compressor circuit, the evaluation circuit configured to determine a first compression level of the respective lossy compressed tensor elements and a second compression level of the lossless-compressed tile; and
a comparison circuit coupled to the evaluation circuit and to the selector circuit, the comparison circuit configured to compare the first compression level to the second compression level and signal to the selector circuit to select the respective lossy compressed tensor elements in response to the first compression level being greater than the second compression level.

8. A circuit arrangement, comprising:
a first storage circuit configured to store a Dmax and a Dmin of decompressed tensor elements of a tile, and compressed tensor elements of the tile that are compressed versions of the of the decompressed tensor elements of the tile, each of Dmax and Dmin represented by a first number of bits and each compressed tensor element represented by a second number of bits, B, that is less than the first number of bits; and
a lossy decompressor circuit configured to decompress each compressed tensor element of the tile into a first respective decompressed tensor element of the tile that is represented by the first number of bits, the lossy decompressor circuit configured to decompress the compressed tensor element into a decompressed tensor element represented by the first number of bits as a function of Dmin, the compressed tensor element, and a ratio of a difference between Dmax and Dmin to a maximum value that can be represented by B bits.

9. The circuit arrangement of claim 8, wherein the lossy decompressor circuit includes:
a plurality of multiplier circuits configured to compute in parallel, respective products of the compressed tensor elements of the tile and an inverse scaling factor; and
a plurality of adder circuits configured to compute respective sums in parallel of the respective products and Dmin.

10. The circuit arrangement of claim 9, further comprising:
another adder circuit configured to compute the difference between Dmax and Dmin; and
wherein the inverse scaling factor is equal to (the difference between Dmax and Dmin)/($2^B-1$).

11. The circuit arrangement of claim 10, further comprising:
a lookup memory addressed by signals indicating a value of B, wherein the lookup memory is configured to output one reciprocal bit count of a plurality of reciprocal bit counts in response to the signals indicating the value of B, wherein each reciprocal bit count is equal to $1/(2^B-1)$ for $1 \leq B \leq 8$; and
another multiplier circuit having inputs coupled to outputs of the other adder and the lookup memory, wherein the other multiplier circuit is configured to generate the inverse scaling factor as a product of the one reciprocal bit count and the difference between Dmax and Dmin.

12. The circuit arrangement of claim 8, further comprising:
a lossless decompressor circuit configured to decompress each compressed tensor element of the tile into a second respective decompressed tensor element of the tile that is represented by the first number of bits; and
a selector circuit configured to select and output either the first respective decompressed tensor element or the second respective decompressed tensor element.

13. The circuit arrangement of claim 12, wherein the first storage circuit is configured to store a format code having a value that indicates whether the tile of compressed tensor elements are in a first format or a second format, the circuit arrangement further comprising:
a format detection circuit coupled to the first storage circuit and to the selector circuit, the format detection circuit configured to determine whether the tile of compressed tensor elements are in a first format or a second format based on the value of the format code, signal to the selector circuit to select the first respective decompressed tensor element in response to the value of the format code indicating the first format, and signal to the selector circuit to select the second respective decompressed tensor element in response to the value of the format code indicating the second format.

14. A circuit arrangement, comprising:
memory circuitry configured as a tensor cache and a weight cache, the tensor cache configured to store a first Dmax and a first Dmin of decompressed tensor elements of an input tile, and compressed tensor elements of the input tile that are compressed versions of the of the decompressed tensor elements of the input tile, each of the first Dmax and first Dmin represented by a first number of bits and each compressed tensor element represented by a second number of bits, B, that is less than the first number of bits;
a lossy decompressor circuit configured to decompress each compressed tensor element of the input tile into a respective decompressed tensor element represented by the first number of bits as a function of the first Dmin, the compressed tensor element, and a ratio of a difference between the first Dmax and the first Dmin to a maximum value that can be represented by B bits;
a tensor processor coupled to input weights from the weight cache and the decompressed tensor elements, the tensor processor configured to generate output tensor elements in an output tile as a function of the decompressed tensor elements and weights; and
a lossy compressor circuit configured to compress each decompressed tensor element of the output tile into a respective lossy compressed tensor element that is represented by B bits, as a function of a maximum value that can be represented by B bits, and a ratio of a difference between a value of the decompressed tensor element and a second Dmin of the output tile to a difference between a second Dmax of the output tile and the second Dmin.

15. The circuit arrangement of claim 14, further comprising:
a min-max circuit configured to determine the second Dmax and the second Dmin of decompressed tensor elements of the output tile; and
wherein the lossy compressor circuit is configured to output the second Dmax and the second Dmin in association with the respective lossy compressed tensor elements to a storage circuit.

16. The circuit arrangement of claim 15, wherein the lossy compressor circuit includes:
- a plurality of adder circuits configured to compute respective differences in parallel between the values of the decompressed tensor elements of the output tile and the second Dmin; and
- a plurality of multiplier circuits configured to compute in parallel respective products of the respective differences and a scaling factor.

17. The circuit arrangement of claim 16, further comprising:
- another adder circuit configured to compute the difference between the second Dmax and the second Dmin; and
- wherein the scaling factor is equal to $(2^B-1)/$(the difference between the second Dmax and the second Dmin).

18. The circuit arrangement of claim 16, wherein each multiplier circuit is configured to round one of the respective products to a value represented by B bits.

19. The circuit arrangement of claim 16, further comprising:
- another adder circuit configured to compute the difference between the second Dmax and the second Dmin;
- a lookup memory coupled to the other adder circuit and addressed by the difference between the second Dmax and the second Dmin; and
- wherein the lookup memory is configured to output the scaling factor that is one scaling factor of a plurality of scaling factors in response to the difference between the second Dmax and the second Dmin.

20. The circuit arrangement of claim 15, wherein the lossy decompressor circuit includes:
- a plurality of multiplier circuits configured to compute in parallel, respective products of the compressed tensor elements of the input tile and an inverse scaling factor; and
- a plurality of adder circuits configured to compute respective sums in parallel of the respective products from the plurality of multiplier circuits and the first Dmin.

\* \* \* \* \*